United States Patent [19]
Noguchi et al.

[11] Patent Number: 5,677,101
[45] Date of Patent: Oct. 14, 1997

[54] LIGHT-SENSITIVE LITHOGRAPHIC PRINTING PLATE HAVING A LIGHT SENSITIVE LAYER COMPRISING A CLATHRATE COMPOUND

[75] Inventors: Kazuo Noguchi; Kaori Fukumuro; Shinichi Matsubara, all of Hino; Yoshihiro Koya, Yokohama; Hiroshi Tomiyasu, Yokohama; Shigeru Kajiwara, Yokohama, all of Japan

[73] Assignee: Konica Corporation, Tokyo, Japan

[21] Appl. No.: 491,731

[22] Filed: Jun. 19, 1995

[30] Foreign Application Priority Data

Jun. 21, 1994 [JP] Japan .................. 6-162611

[51] Int. Cl.⁶ .................. G03F 7/11; G03F 7/023
[52] U.S. Cl. .................. 430/166; 430/165; 430/302
[58] Field of Search .................. 430/166, 165, 430/302

[56] References Cited

U.S. PATENT DOCUMENTS

| | | | |
|---|---|---|---|
| 3,181,461 | 5/1965 | Fromson | 101/149.2 |
| 3,250,727 | 5/1966 | Noll et al. | 252/358 |
| 3,511,661 | 5/1970 | Rauner et al. | 96/86 |
| 3,545,970 | 12/1970 | Giorgianni et al. | 430/376 |
| 4,968,584 | 11/1990 | Nagashima et al. | 430/309 |
| 5,230,988 | 7/1993 | Akiyama et al. | 430/166 |
| 5,254,430 | 10/1993 | Nagashima et al. | 430/166 |

*Primary Examiner*—John S. Chu
*Attorney, Agent, or Firm*—Finnegan, Henderson, Farabow, Garrett & Dunner, L.L.P.

[57] ABSTRACT

Disclosed is a light-sensitive lithographic printing plate which comprises an aluminum plate having a surface subjected to roughening treatment and then anodization treatment and colored by a solution containing a UV absorber so that at an absorption local maximum wavelength between 340 and 450 nm, reflection optical density DS is higher by 0.02 to 0.5 than that obtained when the surface is not colored, and a positive light-sensitive composition layer containing an o-quinonediazide compound and a clathrate compound provided by coating on the aluminum plate after coloration.

3 Claims, No Drawings

LIGHT-SENSITIVE LITHOGRAPHIC PRINTING PLATE HAVING A LIGHT SENSITIVE LAYER COMPRISING A CLATHRATE COMPOUND

BACKGROUND OF THE INVENTION

This invention relates to a positive type light-sensitive lithographic printing plate.

It has been known that when a positive type light-sensitive lithographic printing plate which comprises an aluminum support previously subjected to graining treatment and anodization treatment and a layer of a positive type light-sensitive resin composition provided thereon (hereinafter referred to as "positive type PS plate") is exposed through a positive transparent original image, solubility of an exposed portion in a developing solution is increased, and when the exposed positive type PS plate is processed by a developing solution of a positive type light-sensitive resin composition, an exposed portion of a light-sensitive layer is removed to expose a hydrophilic surface of the support, whereby a positive image is formed.

In recent years, in preparation of an original film, a dot area in a film can be reduced by using a scanner, whereby it becomes unnecessary to carry out dot loss. Further, in a lithographic film having low solid density, when dot loss is carried out, the smallest dots disappear. When an exposure amount is reduced in order to make the smallest dots appear, light is scattered (halation) at an edge portion of a film so that an unnecessary image at said portion is formed on a plate, whereby it is necessary to erase the unnecessary image by an erasing solution after development. Therefore, in a conventional positive type PS plate using a quinonediazide compound as a light-sensitive material, dot loss necessarily occurs so that reproducibility of small dots is worsened.

In Japanese Patent Publication NO. 70813/1993, there is disclosed a method of making tone reproducibility faithful, improving reproducibility of the smallest dots and preventing film edge marks from being formed by coloring an aluminum plate surface subjected to anodization treatment, by a UV-absorbing coating so that at an absorption maximum wavelength in 340 to 450 nm, reflection density DS is higher by 0.08 to 0.4 than that obtained when the surface is not colored.

However, in this technique, when the reflection optical density DS is high, adhesiveness between a light-sensitive layer and grains of a support is gradually lowered so that there is a problem that press life is short. Also, there is a problem that when the UV-absorbing coating is subbed, residual colors are liable to be left at a developed portion and an image contrast is bad.

SUMMARY OF THE INVENTION

An object of the present invention is to provide a light-sensitive lithographic printing plate in which residual colors are reduced and a contrast is high by improving solubility of a light-sensitive layer without lowering press life.

The above object of the present invention can be accomplished by (1) a light-sensitive lithographic printing plate which comprises an aluminum plate having a surface subjected to roughening treatment and then anodization treatment and colored by a solution containing a UV absorber so that at an absorption local maximum wavelength between 340 and 450 nm, reflection optical density DS is higher by 0.02 to 0.5 than that obtained when the surface is not colored, and a positive type light-sensitive composition layer containing an o-quinonediazide compound and a clathrate compound provided by coating on the aluminum plate after coloration, (2) the light-sensitive lithographic printing plate described in the above (1) wherein the clathrate compound is cyclodextrin, (3) a light-sensitive lithographic printing plate which comprises an aluminum plate having a surface subjected to roughening treatment and then anodization treatment and colored by a solution containing a UV absorber and a compound soluble or swellable in an alkaline aqueous solution so that at an absorption local maximum wavelength between 340 and 450 nm, reflection optical density DS is higher by 0.02 to 0.5 than that obtained when the surface is not colored, and a positive type light-sensitive composition layer containing an o-quinonediazide compound provided by coating on the aluminum plate after coloration, (4) the light-sensitive lithographic printing plate described in the above (3) wherein the compound soluble or swellable in an alkaline aqueous solution is a water-soluble polymer, (5) the light-sensitive lithographic printing plate described in the above (4) wherein the water-soluble polymer is selected from the group consisting of starches, celluloses, vinyls and gelatins, and (6) the light-sensitive lithographic printing plate described in the above (3) or (5) wherein the compound soluble or swellable in an alkaline aqueous solution is a novolak resin.

DESCRIPTION OF THE PREFERRED EMBODIMENTS

In the following, the present invention is explained in detail.

First, as the aluminum plate which is a support of the light-sensitive lithographic printing plate, aluminum or an aluminum alloy is used. As the aluminum alloy, there may be used various aluminum alloys, for example, an alloy of aluminum and at least one metal selected from the group consisting of magnesium, manganese, silicon, zinc, lead, bismuth, chromium, iron, copper and nickel.

The support to be used in the present invention is subjected to treatments such as degreasing treatment, graining treatment and anodization treatment which are generally used in this field of the art, but it is preferred to use a support subjected to graining treatment and anodization treatment in this order.

As degreasing treatment for removing rolling oil on the surface of aluminum, there may be mentioned degreasing by a solvent such as Tri-Clene (trade name, produced by Toa Gosei Chemical Industry Co., Ltd.) and a thinner, and degreasing by an emulsion such as kerosine and triethanol. In order to remove stain and a naturally oxidized film which cannot be removed only by degreasing, there may be used a method of carrying out neutralization after alkaline etching and removal of smut by dipping a support in an alkaline solution containing 1 to 15% of sodium hydroxide at 20° to 90° C. for 5 seconds to 10 minutes and then dipping it in an acidic solution containing 10 to 20% of nitric acid or sulfuric acid at 10° to 50° C. for 5 seconds to 5 minutes.

As a method of graining treatment which is carried out for obtaining good adhesiveness to a light-sensitive layer and improving water retention, there may be mentioned the so-called mechanical roughening method in which a surface is roughened mechanically and the so-called electrochemical roughening method in which a surface is roughened electrochemically. The mechanical roughening method includes, for example, methods such as ball grinding, brush grinding, blast grinding and buff grinding. The electrochemical roughening method includes, for example, a method of subjecting a support to electrolysis treatment in an electrolyte containing hydrochloric acid or nitric acid by alternating current or direct current. The support can be grained by using either one of the above methods or a combination of two or more.

On the surface of the support obtained by the graining treatmet as described above, smut is generated. In order to remove the smut, it is generally preferred to carry out suitable treatment such as washing or alkaline etching. As such a treatment, there may be mentioned, for example, the alkaline etching method described in Japanese Patent Publication No. 28123/1973 and the sulfuric acid desmutting method described in Japanese Provisional Patent Publication No. 12739/1978.

In order to improve abrasion resistance, chemical resistance and water retention, the support to be preferably used in the present invention is generally subjected to anodization treatment to form an oxidized film thereon. In the anodization treatment, there may be generally preferably used a method in which electrolysis is effected at a current density of 1 to 10 A/dm$^2$ by using an aqueous solution containing 10 to 50% of sulfuric acid and/or phosphoric acid as an electrolyte. Also, there may be used a method in which electrolysis is effected in sulfuric acid at high current density described in U.S. Pat. No. 1,412,768 and a method in which electrolysis is effected by using phosphoric acid described in U.S. Pat. No. 3,511,661.

It is preferred that the support to be preferably used in the present invention is subjected to pore-sealing treatment after the anodization treatment. As the pore-sealing treatment, there may be mentioned boiled water treatment, water vapor treatment, treatment using sodium silicate, treatment using a dichromate aqueous solution, treatment using nitrite and treatment using ammonium acetate.

Further, the support to be preferably used in the present invention is subjected to coloring treatment according to the present invention, and a hydrophilic subbing layer may be provided on said support. As the hydrophilic subbing layer, there may be mentioned a hydrophilic subbing layer containing alkali metal silicate described in U.S. Pat. No. 3,181,461, hydrophilic cellulose described in U.S. Pat. No. 1,860,426, amino acid and a salt thereof described in Japanese Provisional Patent Publications No. 149491/1985 and No. 165183/1988, amines having a hydroxyl group and salts thereof described in Japanese Provisional Patent Publication No. 232998/1985, phosphate described in Japanese Provisional Publication No. 19494/1987 and a polymer compound comprising a monomer unit having a sulfo group described in Japanese Provisional Patent Publication No. 101651/1984. The coloring treatment of the present invention may be carried out by an embodiment that a UV absorber is added to said subbing layer.

The surface of the aluminum plate subjected to the treatments described above is colored by a solution containing a UV absorber in the present inventions (1) and (2) or a solution containing a UV absorber and a compound soluble or swellable in an alkaline aqueous solution in the present inventions (3) to (6) so that at an absorption local maximum wavelength between 340 and 450 nm, reflection optical density DS is higher by 0.02 to 0.5 than that obtained when the surface is not colored.

It is preferred that the UV absorption wavelength of a dye is approximately coincident with that of a light-sensitive component. It is preferred that the dye absorbs UV rays between 340 and 450 nm which is a wavelength of o-quinonediazide generally used, and it is particularly preferred that it has absorption maximum between 340 and 450 nm. The dye as described above is mixed with an organic solvent without using water, or mixed with water and an organic solvent to prepare a mixed solution, and the mixed solution is coated by a known method, for example, a dipping system, a roll coating system and a bar coating system. The amount to be coated is preferably such an amount that reflection optical density DS at a dye absorption local maximum wave-length in the absorption band of o-quinonediazide is higher by 0.02 to 0.5, preferably 0.02 to 0.2, than that obtained when the dye is not coated, and the amount to be attached is preferably 0.5 g/m$^2$ or less. If increase in DS is less than 0.02, the effect of increasing tone reproducibility is weak, while if it exceeds 0.5, sensitivity is greatly lowered. The reflection optical density DS is measured by an integrating sphere type reflective spectrophotometer.

As the UV absorber, there may be various UV absorbers, and when a monobasic acidic dye, i.e., an acidic dye having only one sulfone group or carboxyl group in one molecule thereof is used, the effect of reducing residual colors is large. As a specific example of the monobasic acidic dye, there may be mentioned, for example, C.I. Acid Yellow 11

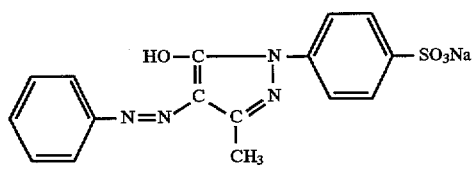

-continued

C.I. Acid Yellow 25

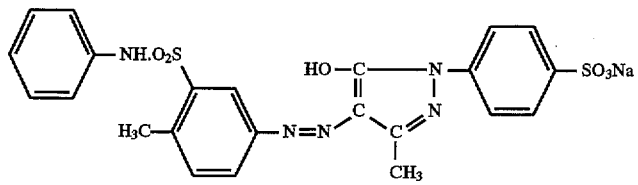

C.I. Acid Yellow 29

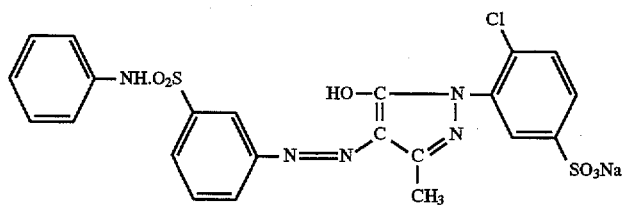

C.I. Acid Yellow 36

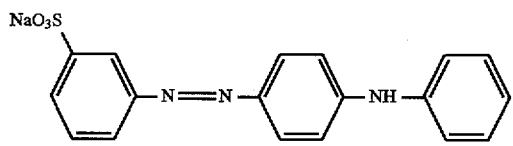

C.I. Acid Yellow 40

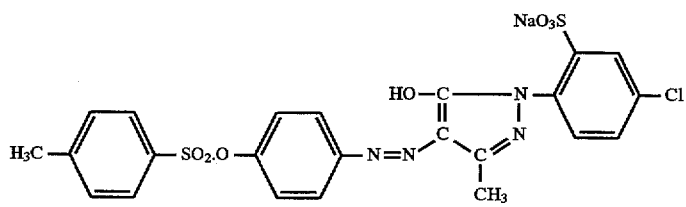

C.I. Acid Yellow 76

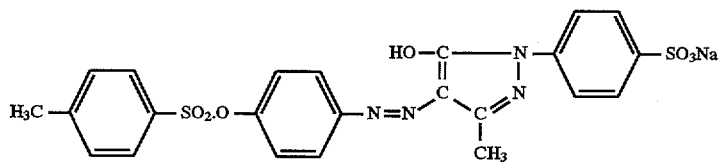

C.I. Acid Yellow 99 chromate

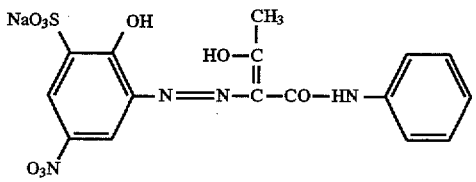

Compound (II)

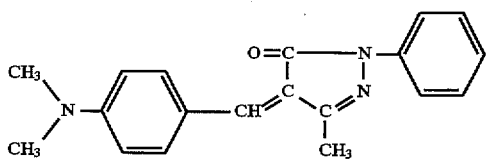

These UV absorbers may be used singly or in combination of two or more and may contain other compound, for example, gum arabic, carboxymethyl cellulose, carboxyethyl cellulose, carboxymethylhydroxyethyl cellulose, alginic acid, polyacrylic acid and acrylic acid derivatives, a copolymer of vinylmethyl ether and maleic anhydride, a copolymer of vinyl acetate and maleic anhydride, polyvinylsulfonic acid, a salt thereof and a water-soluble metal salt thereof (e.g., zinc acetate) or fine particles such as silica or titanium dioxide, if necessary.

Further, there may be contained a pH-adjusting agent of the dye, particularly an amine, an amino acid, a salt of an amine or a salt of an amino acid. As the amine, there may be mentioned ammonia, methylamine, dimethylamine, trimethylamine, ethylamine, diethylamine, triethylamine, propylamine, dipropylamine, tripropylamine, monoethanolamine, diethanolamine, triethanolamine, allylamine, diallylamine, triallylamine, tributylamine, tert-butylamine, ethylenediamine, piperidine, pyridine, hydrazine, cyclohexylamine and aniline. As the amino acid, there may be mentioned glycine, alanine, valine, leucine, isoleucine, dihydroxyethylglycine, serine, threonine, aspartic acid, glutamic acid, lysine, arginine, phenylalanine, tyrosine, histidine, tryptophane, proline and oxyproline. As an acid used for the salt of an amine or an amino acid, there may be mentioned hydrochloric acid, nitric acid, sulfuric acid and acetic acid, and hydrochloric acid is particularly preferred.

The pH of the UV absorber coating solution is preferably a pH at which the absorbance of the UV absorber is increased, and the pH is particularly preferably in the range of 2.5 to 8.0. If the pH is lower than 2.5, the dye is strongly adsorbed to the anodized film, whereby a non-image portion is colored after development. If the pH is higher than 8.0, not only a risk that o-quinonediazide is decomposed is involved, but also performance of a compound generating a photodissociation material which changes color tone by interaction with the dye in the light-sensitive layer.

By adding the above pH-adjusting agent, not only the absorption intensity of the dye can be increased, but also the effect of reducing residual colors can be enlarged.

In the present inventions (3) to (6), as a compound to be used with the UV absorber described above, there may be mentioned a compound soluble or swellable in an alkaline aqueous solution.

The compound soluble in an alkaline aqueous solution is a water-soluble polymer. The water-soluble polymer is selected from the group consisting of starches (e.g., natural polymeric gelatin), celluloses (e.g., semisynthetic hydroxypropyl cellulose and carboxymethyl acellulose), vinyls (e.g., polyvinyl alcohol and carboxyvinyl polymer) and gelatins. The amount to be formulated is preferably 0.01 to 50% by weight in all the coating solution of UV absorbers, and the amount to be attached is preferably 0.5 g/m² or less.

As the compound swellable in an alkaline aqueous solution, a novolak resin, a vinyl type (co)polymer resin and polymer latexes are preferred. The amount to be formulated is preferably 0.01 to 50% by weight in all the coating solution of UV absorbers, and the amount to be attached is preferably 0.5 g/m² or less.

As the novolak resin and the vinyl type (co)polymer resin, there may be used those mentioned in explanation of a positive type light-sensitive composition layer described below.

As the polymer latexes, there may be mentioned a homopolymer of a monomer selected from Group A described below, a copolymer of two or more monomers selected from Group A, a polymer latex obtained by copolymerizing at least one monomer selected from Group A and at least one monomer selected from Group B, or a polymer latex obtained by using at least one monomer selected from Group A and at least one monomer selected from Group B in combination with at least one monomer selected from Group C.

Group A: monomers represented by the following formula:

CHX=CYZ wherein X represents a hydrogen atom, a methyl group a —COOR$^1$ group; Y represents a hydrogen atom, a methyl group, —(CH2)$_6$COOR$^2$, a halogen or a nitrile; Z represents an aryl group, —COOR$^3$, —OR$^3$, —O—COR$^3$, —CONR$^3$, a halogen or a nitrile; R$^1$, R$^2$ and R$^3$ may be the same or different and each represent an aliphatic group or an aromatic group; and n represents an integer of 0 to 3.

Group B: ethylene type monomers having at least one of a free carboxylic acid group, a sulfonic acid group, or a phosphoric acid group and a salt thereof, and hydroxyalkyl esters and amides of said carboxylic acid.

Group C: divinyl type monomers.

In the formula of Group A, among the groups represented by R$^1$ to R$^3$, the aliphatic group includes a straight or branched alkyl group (including a cyclic one) and a substituted alkyl group. The number of carbons of the alkyl group is preferably 1 to 12.

As a substituent of the substituted alkyl group, there may be mentioned an aryl group, an aryloxy group, a halogen atom, a cyano group, an acyl group, an alkylcarbonyloxy group, an arylcarbonyloxy group, an amino group (including a substituted amino group; as a substituent, there may be mentioned an alkyl group and an aryl group; and the number of the substituent is 1 or 2), a hydroxyl group, an alkoxy group and a hetero ring residue (as a hetero atom, there may be mentioned, for example, an oxygen atom, a nitrogen atom and a sulfur atom; the number of members forming the ring is preferably 5 or 6; the ring may be unsaturated or saturated; and the hetero ring may be further fused by an aromatic ring).

Among the groups represented by R$^1$ to R$^3$, the aryl group includes substituted phenyl and naphthyl groups as a matter of course, and as a substituent, there may be mentioned an alkyl group in addition to the substituents described above as to the substituted alkyl group. As the monomers of Group A, there may be mentioned, for example, monofunctional monomers such as acrylic acid ester, methacrylic acid ester, crotonic acid ester, vinyl ester, maleic acid diester, fumaric acid diester, itaconic acid diester and styrenes.

As specific examples of the monomers, there may be mentioned methyl acrylate, ethyl acrylate, n-propyl acrylate, isopropyl acrylate, n-butyl acrylate, isobutyl acrylate, sec-butyl acrylate, amyl acrylate, hexyl acrylate, 2-ethylhexyl acrylate, octyl acrylate, tert-octyl acrylate, 2-phenoxyethyl acrylate, 2-chloroethyl acrylate, 2-bromoethyl acrylate, 4-chlorobutyl acrylate, cyanoethyl acrylate, 2-acetoxyethyl acrylate, dimethylaminoethyl acrylate, benzyl acrylate, methoxybenzyl acrylate, 2-chlorocyclohexyl acrylate, cyclohexyl acrylate, furfuryl acrylate, tetrahydrofurfuryl acrylate, phenyl acrylate, 5-hydroxypentyl acrylate, 2,2-dimethyl-3-hydroxypropyl acrylate, 2-methoxyethyl acrylate, 3-methoxybutyl acrylate, 2-ethoxyethyl acrylate, 2-iso-propoxyethyl acrylate, 2-butoxyethyl acrylate, 2-(2-methoxyethoxy) ethyl acrylate, 2-(2-butoxyethoxy)ethyl acrylate, ω-methoxypolyethylene glycol acrylate (addition molar number n=9), 1-bromo-2-methoxyethyl acrylate, 1,1-dichloro-2-ethoxyethyl acrylate, methyl methacrylate, ethyl methacrylate, n-propyl methacrylate, isopropyl methacrylate, n-butyl methacrylate, isobutyl methacrylate, sec-butyl methacrylate, amyl methacrylate, hexyl methacrylate, cyclohexyl methacrylate, benzyl methacrylate, chlorobenzyl methacrylate, octyl methacrylate, N-ethyl-N-phenylaminoethyl methacrylate, 2-(3-phenylpropyloxy)ethyl methacrylate, dimethylaminophenoxyethyl methacrylate, furfuryl methacrylate, tetrahydrofurfuryl methacrylate, phenyl methacrylate, cresyl methacrylate, naphthyl methacrylate, 2-hydroxyethyl methacrylate, 3-hydroxypropyl methacrylate, 4-hydroxybutyl methacrylate, triethylene glycol monomethacrylate, dipropylene glycol monomethacrylate, 2-methoxyethyl methacrylate, 3-methoxybutyl methacrylate, 2-acetoxyethyl methacrylate, acetoacetoxyethyl methacrylate, 2-ethoxyethyl methacrylate, 2-isopropoxyethyl methacrylate, 2-butoxyethyl methacrylate, 2-(2-methoxyethoxy)ethyl methacrylate, 2-(2-ethoxyethoxy)ethyl methacrylate, 2-(2-butoxyethoxy)ethyl methacrylate, ω-methoxypolyethylene glycol methacrylate (addition molar number n=6), vinyl acetate, vinyl propionate, vinyl butyrate, vinyl isobutyrate, vinyldimethyl propionate, vinylethyl butyrate, vinyl valerate, vinyl caproate, vinyl chloroacetate, vinyl dichloroacetate, vinylmethoxy acetate, vinylbutoxy acetate, vinylphenyl acetate, vinyl acetoacetate, vinyl lactate, vinyl-β-phenyl butyrate, vinylcyclohexyl carboxylate, vinyl benzoate, vinyl salicylate, vinyl chlorobenzoate, vinyl tetrachlorobenzoate, vinyl naphthoate, styrene, methylstyrene, dimethylstyrene, trimethylstyrene, ethylstyrene, diethylstyrene, isopropylstyrene, butylstyrene, hexylstyrene, cyclohexylstyrene, decylstyrene, benzylstyrene, chloromethylstyrene, trifluoromethylstyrene, ethoxymethylstyrene, acetoxymethylstyrene, methoxystyrene, 4-methoxy-3-methylstyrene, dimethoxystyrene, chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethylstyrene, 4-fluoro-3-trifluoromethylstyrene, methyl vinyl benzoate, butyl crotonate, hexyl crotonate, glycerine monocrotonate, dimethyl itaconate, diethyl itaconate, dibutyl itaconate, diethyl maleate, dimethyl maleate, dibutyl maleate, diethyl fumarate, dihexyl fumarate, dibutyl fumarate, methylacrylamide, ethylacrylamide, propylacrylamide, isopropylacrylamide, butylacrylamide, tert-butylacrylamide, heptylacrylamide, tert-octylacrylamide, cyclohexylacrylamide, benzylacrylamide, hydroxymethylacrylamide, methoxyethylacrylamide, dimethylaminoethylacrylamide, hydroxyethylacrylamide, phenylacrylamide, hydroxyphenylacrylamide, tolylacrylamide, naphthylacrylamide, dimethylacrylamide, diethylacrylamide, dibutylacrylamide, diisobutylacrylamide, N-(1,1-dimethyl-3-oxobutyl)acrylamide, methylbenzylacrylamide, benzyloxyethylacrylamide, β-cyanoethylacrylamide, acryloylmorpholine, N-methyl-N-acryloylpiperazine, N-acryloylpiperidine, N-(1,1-dimethyl-3-hydroxybutyl)acrylamide, N-β-morpholinoethylacrylamide, N-acryloylhexamethyleneimine, N-hydroxyethyl-N-methylacrylamide, N-2-acetamidoethyl-N-acetylacrylamide, methylmethacrylamide, tert-butylmethacrylamide, tert-octylmethacrylamide, benzylmethacrylamide, cyclohexylmethacrylamide, phenylmethacrylamide, dimethylmethacrylamide, diethylmethacrylamide, dipropylmethacrylamide, hydroxyethyl-N-methylmethacrylamide, N-methyl-N-phenylmethacrylamide, N-ethyl-N-phenylmethacrylamide and methacrylhydrazine;

allyl compounds such as allyl acetate, allyl caproate, allyl caprylate, allyl laurate, allyl palmitate, allyl stearate, allyl benzoate, allyl acetoacetate, allyl lactate, allyloxyethanol, allylbutyl ether and allylphenyl ether;

vinyl ethers such as methyl vinyl ether, butyl vinyl ether, hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether and dimethylaminoethyl vinyl ether;

vinyl ketones such as methyl vinyl ketone, phenyl vinyl ketone and methoxyethyl vinyl ketone;

olefins including unsubstituted hydrocarbons such as dicyclopentadiene, ethylene, propylene, 1-butene, 1-pentene, 1-hexene, 4-methyl-1-pentene, 1-heptene, 1-octene, 1-decene, 5-methyl-1-nonene, 5,5-dimethyl-1-octene, 4-methyl-1-hexene, 4,4-dimethyl-1-pentene, 5-methyl-1-heptene, 5-methyl-1-heptene, 4,4-dimethyl-1-hexene, 5,5,6-trimethyl-1-heptene, 1-dodecene and 1-octadecene, and diene compounds such as butadiene, isoprene and chloroprene;

heterocyclic vinyl compounds (as a hetero atom, there may be mentioned, for example, a nitrogen atom, an oxygen atom, and a sulfur atom; the number of members forming the heterocyclic ring is, for example, 5 or 6; and an aromatic ring may be further fused to this ring) such as N-vinyloxazolidone, vinylpyridine, vinylpicoline, N-vinylimidazole, N-vinyl-2-methylimidazole, N-vinyltriazole, N-vinyl-3,5-dimethyltriazole, N-vinylpyrrolidone, N-vinyl-3,5-dimethylpyrazole, N-vinylcarbazole, vinylthiophene, N-vinylsuccinimide, N-vinylglutarimide, N-vinyladipimide, N-vinylpiperidone, N-vinyl-ε-caprolactam and N-vinyl-2-pyridone;

unsaturated nitriles such as acrylonitrile and methacrylonitrile; and vinyl halide compounds such as vinyl chloride, vinylidene chloride, vinyl bromide and vinyl iodide.

As specific examples of the monomers of Group B, there may be mentioned the following monofunctional monomers such as acrylic acid, methacrylic acid, itaconic acid, maleic acid, a monoalkyl itaconate (e.g., monomethyl itaconate, monoethyl itaconate and monobutyl itaconate), a monoalkyl maleate (e.g., monomethyl maleate, monoethyl maleate, monobutyl maleate and monooctyl maleate), citraconic acid, styrenesulfonic acid, vinylbenzylsulfonic acid, vinylsulfonic acid, an acryloyloxyalkylsulfonic acid (e.g., acryloyloxymethylsulfonic acid, acryloyloxyethylsulfonic acid, acryloyloxypropylsulfonic acid and acryloyloxybutylsulfonic acid), a methacryloyloxyalkylsulfonic acid (e.g., methacryloyloxymethylsulfonic acid, methacryloyloxyethylsulfonic acid, methacryloyloxypropylsulfonic acid and methacryloyloxybutylsulfonic acid), an acrylamidoalkylsulfonic acid (e.g., 2-acrylamido-2-methylethanesulfonic acid, 2-acrylamido-2-methylpropanesulfonic acid and 2-acrylamido-2-methylbutanesulfonic acid), a methacrylamidoalkylsulfonic acid (e.g., 2-methacrylamido-2-methylethanesulfonic acid, 2-methacrylamido-2-methylpropanesulfonic acid and 2-methacrylamido-2-methylbutanesulfonic acid), an acryloyloxyalkyl phosphate (e.g., acryloyloxyethyl phosphate and 3-acryloyloxypropyl phosphate) and a methacryloyloxyalkyl phosphate (e.g., methacryloyloxyethyl phosphate and 3-methacryloyloxypropyl phosphate).

As the alkyl group in the above monomers, there may be mentioned, for example, an alkyl group having about 1 to 8 carbon atoms. The above acid may be a salt of an alkali metal ion (preferably $Na^+$ and $K^+$) or an ammonium ion.

As specific examples of the monomers of Group C, there may be mentioned unsaturated esters of a polyol, particularly α-methylenecarboxylic acid esters, for example, ethylene di(meth)acrylate, diethylene glycol di(meth)acrylate, glycerol di(meth)acrylate, glycerol tri(meth)acrylate, 1,3-propylene di(meth)acrylate, 1,4-cyclohexanediol (meth) acrylate, 1,4-benzenediol di(meth)acrylate, pentaerythritol tetra(meth)acrylate, 1,3-propylene glycol di(meth)acrylate, 1,5-pentanediol di(meth)acrylate and trimethylolpropane tri (meth)acrylate; unsaturated amides, particularly α-methylenecarboxylic acid amides and particularly α,ω-diamines and ω-diamines in which oxygen exists intermediately, for example, methylenebis(meth) acrylamide, ethylenebis(meth)acrylamide, 1, 6-hexamethylenebis(meth)acrylamide and diethylenetriaminetris(meth)acrylamide, vinyl esters such as divinyl succinate, divinyl adipate, divinyl phthalate, divinyl terephthalate, divinylbenzene-1,3-disulfonate and divinylbutane-1,4-disulfonate, and an unraturated aldehyde such as sorbic aldehyde, i.e., 2,4-hexadienal; and polyesters and polyamides of neutral α-methylenecarboxylic acid such as (meth)acrylate and (meth)acrylamide, and/or esters and amides of primary and secondary amino alcohols, aminopolyol, polyamino alcohol or polyol and analogous derivatives of the above alcohols, for example, β-methacrylamidoethyl(meth)acrylamide, N-(β-hydroxyethyl)-β-(methacrylamide)ethyl acrylate, N,N-bis(β-methacryloyloxyethyl)acrylamide, and further a urethane compound from divinylbenzene or xylylene diisocyanate and hydroxyethyl(meth)acrylate, for example, a urethane compound from isocyanate and a hydroxyalkyl compound such as a urethane compound having the following chemical structure.

lic acid such as phthalic acid, succinic acid, sebacic acid and maleic acid; a cellulose ether compound such as methyl cellulose, ethyl cellulose, propyl cellulose, butyl cellulose, allyl cellulose, benzyl cellulose, cyclohexyl cellulose and cyanoethyl cellulose; polyester; polyamide; polyurethane; polyurea; and polyimide is useful as a resin which can be used in the present invention. An emulsion of said compound can be prepared according to the method disclosed in Japanese Provisional Patent Publication No. 3653/1977.

Also, a commercially available latex liquid can be used. There may be mentioned, for example, emulsions of polyacrylic acid ester copolymers such as Julimer ET-410, Julimer SEK-301, Julimer SEK-101, Julimer FC-30, Julimer FC-60, Julimer FC-80, Julimer SE-5101, Julimer SE-5102, Julimer SE-5103, Julimer SE-5301, Julimer SE-361, Julimer SE-363, Julimer SE-365, Julimer SE-6302, Julimer SE-6311 and Julimer SE-6312 (all trade names, produced by Nihon Junyaku Co.), Nipol LX811, Nipol LX814, Nipol LX841, Nipol LX851, Nipol LX852, Nipol LX854, Nipol LX856, Nipol LX860 and Nipol LX874 (all trade names, produced by Nihon Zeon Co.), Primal AC-22, Primal AC-33, Primal AC-3444, Primal AC-55, Primal AC-61, Primal AC-382, Primal ASE-60, Primal ASE-75, Primal ASE-108, Primal B-15, Primal B-41, Primal B-74, Primal B-336, Primal B-50, Primal B-832, Primal B-924, Primal C-72, Primal E-32, Primal E-358, Primal HA-8, Primal HA-16, Primal HA-24, Primal 1-94, Primal LC-40, Primal LT-76, Primal LT-87, Primal MC-4530, Primal N-580, Primal P-6N, Primal P-1060, Primal S-1, Primal TR-49 and Primal 850 (all trade names, produced by Nihon Acryl Kagaku Co.);

acrylonitrile.butadiene type latexes such as Nipol 1551, Nipol 1561, Nipol 1562, Nipol 1571, Nipol 1577, Nipol

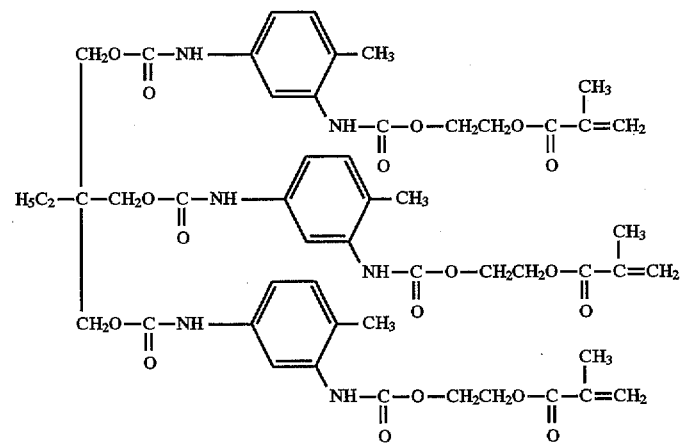

In the above description, "(meth)acrylate" means both of "acrylate" and "methacrylate", and "(meth)acrylamide" means both of "acrylamide" and "methacrylamide".

The latex polymer to be used in the present invention can be synthesized by, for example, the emulsification polymerization method described in "Preparative methods of Polymer Chemistry" published by Interscience Publishers, p. 216 and p. 239.

In preparation of the latex, a polymer compound produced by condensation polymerization of a resin to which the emulsification polymerization method cannot be applied, for example, an acetal resin such as a formal resin or a butyral resin; a cellulose ester such as cellulose acetate, cellulose propionate, cellulose butyrate and cellulose crotonate; a co-ester compound of said ester compound and a dicarboxy- LX511, Nipol LX513, Nipol LX531 and Nipol LX531B (all trade names, produced by Nihon Zeon Co.);

styrene.butadiene type latexes such as Nipol LX111, Nipol 4850, Nipol 4850A, Nipol LX110, Nipol LX119, Nipol LX204, Nipol LX206, Nipol LX209, Nipol 2507, Nipol LX303, Nipol 2518FS, Nipol LX415A, Nipol LX426, Nipol LX430, Nipol LX432A, Nipol LX433, Nipol LX472, Nipol 2570X5, Nipol LX407BP, Nipol LX407C, Nipol LX407F and Nipol 407G (all trade names, produced by Nihon Zeon Co.);

vinyl chloride type latexes such as Geon 150X15, Geon 351 and Geon 576 (all trade names, produced by Nihon Zeon Co.);

urethane resin emsulsions such as VONDIC 1041NS, VONDIC 1050B-NS, VONDIC 1230NS, VONDIC 1250, VONDIC 1310NSC, VONDIC 1320NSC, VONDIC 1510, VONDIC 1610NS, VONDIC 1512NSC, VONDIC 1640, VONDIC 1660NS, VONDIC 1670NS, VONDIC 1930A-NS, VONDIC 1980NS, VONDIC 1205, VONDIC 2220 and VONDIC 2230 (all trade names, produced by Dainippon Ink Kagaku Co.), and Alon Neotan UE-1101, Alon Neotan UE-1200, Alon Neotan UE-1300, Alon Neotan UE-1420, Alon Neotan UE-2103, Alon Neotan UE-2200, Alon Neotan UE-2600, Alon Neotan UE-2900, Alon Neotan UE-5404 and Alon Neotan UE-5600 (all trade names, produced by Toa Gosei Kagaku Kogyo Co.); and colloid dispersion type urethane resins such as HYDRAN HW-301, HYDRAN HW-310, HYDRAN HW-311, HYDRAN HW-312B, HYDRAN HW-333, HYDRAN HW-340, HYDRAN HW-350, HYDRAN HW-111, HYDRAN HW-140, HYDRAN HW-910, HYDRAN HW-920, HYDRAN HW-930, HYDRAN HW-940, HYDRAN HW-950 and HYDRAN HW-960 (all trade names, produced by Dainippon Ink Kagaku Kogyo Co.). When a commercially available latex is used, it is necessary to consider that properties thereof are influenced by the kind or the like of an emulsification stabilizer.

It is preferred that the polymer including the latex prepared by a method other than the emulsification polymerization method has at least one group selected from the group consisting of hydroxyl, amino, amide, imino, imide, nitrilo, carboxyl, sulfonyl, sulfonoxy, isocyanate, urethane, azoimide, azo, hydrazino, carbamide, carbamyl, epoxy, mercapto, thio and sulfonamide groups in a main chain or a side chain thereof. The particle size of a lipophilic resin in the emulsion is not particularly limited. In general, the lipophilic resin having a size distribution in the range of about 0.03 to 10 μm can be used, and the particle size is preferably about 0.05 to 5 μm. As the polymer forming emulsion particles, there can be used from a polymer having a high molecular weight to an oligomer, i.e., a polymer having a molecular weight of about 2,000 to about 200,000, and also a mixture thereof may be used. The polymer forming the particles may be crosslinked or may have properties of being cured by active rays or heat. The polymer latexes described above may be used singly or may be used as a mixture of two or more.

The compounds soluble or swellable in an alkaline aqueous solution described above can be used singly or in combination of two or more.

The light-sensitive lithographic printing plate of the present invention can be obtained by coating a positive type light-sensitive composition layer (a light-sensitive layer) containing o-quinonediazide and a clathrate compound in the present inventions (1) and (2) or by coating a positive type light-sensitive composition layer containing o-quinonediazide in the present inventions (3) to (6) on the support subjected to the coloring treatment as described above. The light-sensitive component to be used in the light-sensitive layer is not particularly limited, and there may be used, for example, various materials generally used in a light-sensitive lithographic printing plate, as described below.

Clathrate compound

As the clathrate compound to be used in the present inventions (1) and (2), there may be mentioned a general clathrate compound, for example, cyclic D-glucans, cyclophans, neutral polyligands, cyclic polyanions, cyclic polycations, cyclic peptides, spherands, cavitands and non-cyclic analogues thereof.

As the cyclic D-glucans and non-cyclic analogues thereof, there may be mentioned, for example, a compound in which α-D-glucopyranoses are liked by a glycoxide bond. As said compound, there may be mentioned glucides constituted by a D-glucopyranose group such as starch, amylose and amylopectin; cyclodextrins such as α-cyclodextrin, β-cyclodextrin, γ-cyclodextrin and cyclodextrin in which a D-glucopyranose group has a polymerization degree of 9 or more; and modified D-glucans in which a substituent such as a $SO_3C_6H_5CH_2C_6H_5SO_3$ group, a $NHCH_2CH_2NH$ group, a $NHCH_2CH_2NHCH_2CH_2NH$ group, a $SC_6H_5$ group, a $N_3$ group, a $NH_2$ group, a $NEt_2$ group, a $SC(NH_2^+)NH_2$ group, a $SH$ group, a $SCH_2CH_2NH_2$ group, an imidazole group and an ethylenediamine group is introduced, represented by the following formulae:

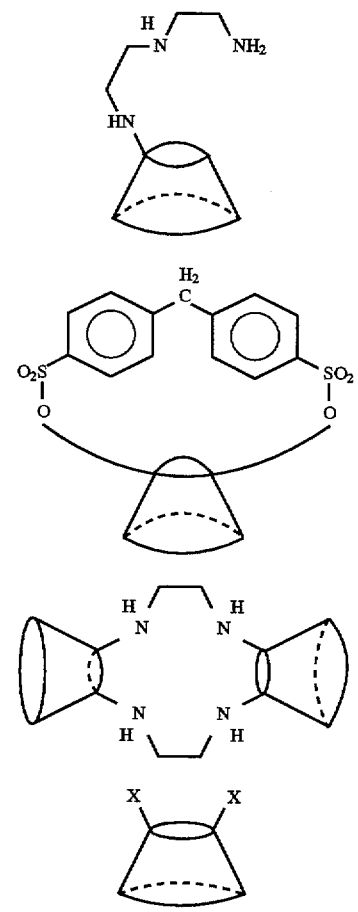

wherein X represents $C_6H_5$, $N_3$, $NH_2$, $N(C_2H_5)_2$, $SC(NH_2^+)NH_2$, $SH$, $SCH_2CH_2NH_2$ or

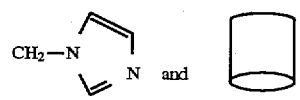

and represents cyclodextrin.

The cyclophans are cyclic compounds each having a structure that aromatic rings are linked by various bonds, and many compounds have been known. As the bonds which link the aromatic rings, there may be mentioned, for example, a single bond, a —$(CR_1R_2)_m$— bond, a —O(CR$_1$R$_2$)$_m$O— bond, a —NH(CR$_1$R$_2$)$_m$NH— bond, a —(CR$_1$R$_2$)$_p$NR$_3$(CR$_4$RS)$_q$— bond, a —(CR$_1$R$_2$)$_p$N+R$_3$R$_4$(CR$_5$R$_6$)$_q$— bond, a —(CR$_1$R$_2$)$_p$SR$_3$(CR$_4$RS)$_q$— bond, a —CO$_2$— bond, a —CONR— bond (where R$_1$, R$_2$, R$_3$, R$_4$, R$_5$ and R$_6$ may be the same or different and each represent a hydrogen atom or an alkyl group having 1 to 3 carbon atoms; and m, p and q may be the same or different and each represent an integer of 1 to 4). As said compound, there may be mentioned, for example, paracyclophans represented by the following formulae:

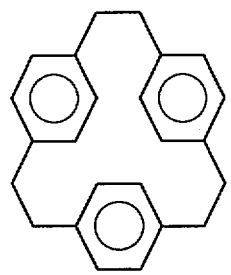

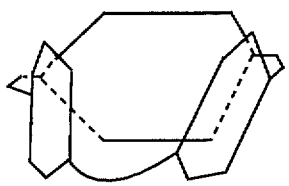

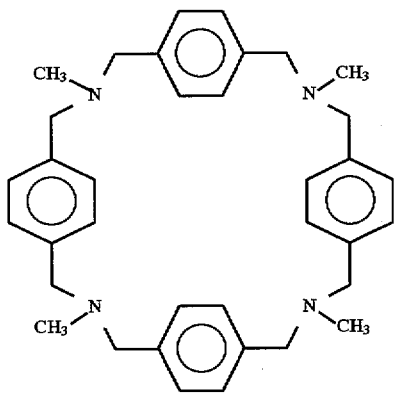

wherein

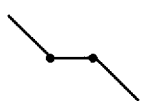

represents —CH$_2$CH$_2$—, orthocyclophans represented by tri-o-thymotide and cyclotriveratrylene, represented by the following formulae:

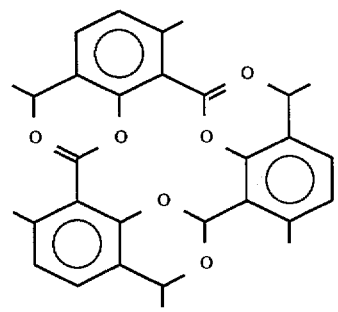

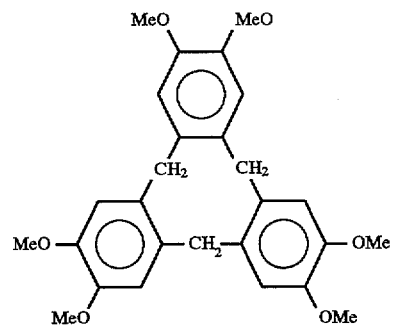

wherein Me represents a methyl group, metacyclophans represented by metacyclophan, callix allene and a resorcinol-aldehyde cyclic oligomer, represented by the following formulae:

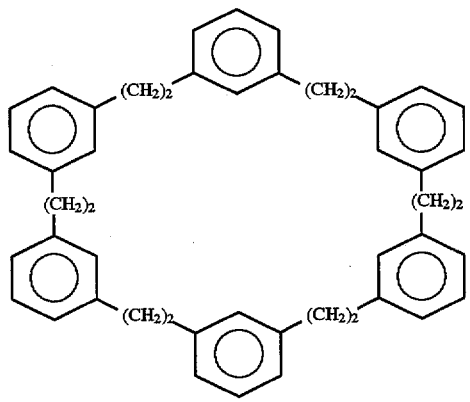

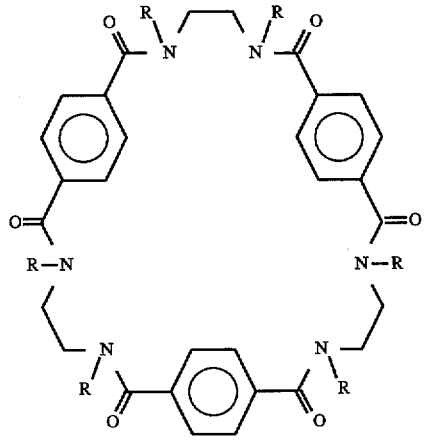

wherein R represents $CH_2C_6H_5$,

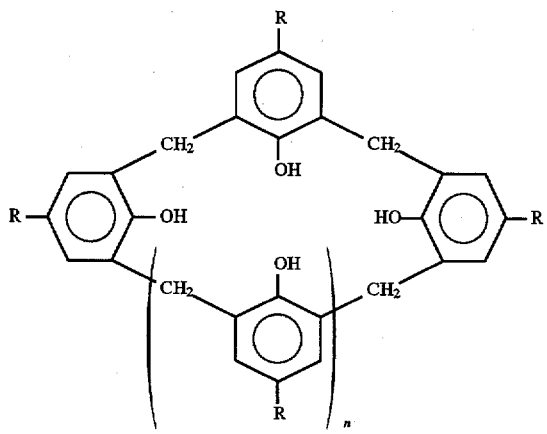

wherein R represents $C_1$, $CH_3$, $t-C_4H_9$, $C_6H_5$, $CO_2C_2H_5$ or $i-C_3H_7$, and n represents 4, 5, 6, 7 or 8, and

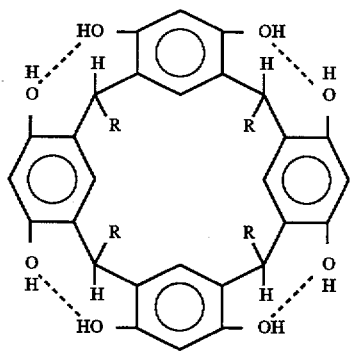

wherein R represents $CH_3$ or $C_6H_5$, and a p-substituted phenol non-cyclic oligomer represented by the following formula:

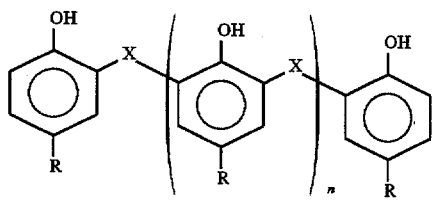

wherein X represents —$CH_2$—, —S— or a single bond, R represents $CH_3$ or $t-C_4H_9$, and n represents an integer of 1 to 10.

As the neutral polyligand, there may be mentioned a crown compound, a cryptand, a cyclic polyamine and non-cyclic analogues thereof. It has been known that said compound takes metallic ions therein effectively, but it can also take cationic organic molecules therein effectively.

Positive type light-sensitive composition containing o-quinonediazide compound

In the positive type light-sensitive composition containing an o-quinonediazide compound to be used in the light-sensitive layer of the present invention, it is preferred to use the compound soluble in an alkaline aqueous solution described above in combination.

As the o-quinonediazide compound, there may be mentioned, for example, an ester compound of a polycondensed resin of o-naphthoquinonediazidesulfonic acid, a phenol and an aldehyde or a ketone.

As the phenol, there may be mentioned, for example, a monovalent phenol such as phenol, o-cresol, m-cresol, p-cresol, 3,5-xylenol, carvacrol and thymol, a divalent phenol such as catechol, resorcin and hydroquinone, and a trivalent phenol such as pyrogallol and phloroglucin. As the aldehyde, there may be mentioned formaldehyde, benzaldehyde, acetaldehyde, crotonaldehyde and furfural. Among them, formaldehyde and benzaldehyde are preferred. As the ketone, there may be mentioned acetone and methyl ethyl ketone.

As a specific example of the above polycondensed resin, there may be mentioned a phenol.formaldehyde resin, a m-cresol.formaldehyde resin, a m- and p-mixed cresol.formaldehyde resin, a resorcin.benzaldehyde resin and a pyrogallol.acetone resin.

In the above o-naphthoquinonediazide compound, the condensation ratio of o-naphthoquinonediazidesulfonic acid based on an OH group of the phenol (reactivity based on one OH group) is preferably 15 to 80%, more preferably 20 to 45%.

Further, as the o-quinonediazide compound to be used in the present invention, there may be mentioned the following compounds described in Japanese Provisional Patent Publication No. 43451/1983, i.e., known 1,2-quinonediazide compounds such as 1,2-benzoquinonediazidesulfonate, 1,2-naphthoquinonediazidesulfonate, 1,2-benzoquinonediazidesulfonic acid amide and 1,2-naphthoquinonediazidesulfonic acid amide. As a further specific example thereof, there may be mentioned 1,2-quinonediazide compounds such as phenyl 1,2-benzoquinonediazide-4-sulfonate, 1,2,1',2'-di-(benzoquinonediazide-4-sulfonyl)-dihydroxybiphenyl, 1,2-benzoquinonediazide-4-(N-ethyl-N-β-naphthyl)-sulfonamide, cyclohexyl 1,2-naphthoquinonediazide-5-sulfonate, 1-(1,2-naphthoquinonediazide-5-sulfonyl)-3,5-dimethylpyrazole, 1,2-naphthoquinonediazide-5-sulfone-4'-hydroxydiphenyl-4'-azo-β-naphthol ester, N,N-di-(1,2-naphthoquinonediazide-5-sulfonyl)-aniline, 2'-(1,2-naphthoquinonediazide-5-sulfonyloxy)-1-hydroxy-anthraquinone, 1,2-naphthoquinonediazide-5-sulfone-2,4-dihydroxybenzophenone ester, 1,2-naphthoquinonediazide-5-sulfonic acid-2,3,4-trihydroxybenzophenone ester, a condensate of 2 mole of 1,2-naphthoquinonediazide-5-sulfonic acid chloride and 1 mole of 4,4'-diaminobenzophenone, a condensate of 2 mole of 1,2-naphthoquinonediazide-5-sulfonic acid chloride and 1 mole of 4,4'-di-hydroxy-1,1'-diphenylsulfone, a condensate of 1 mole of 1,2-naphthoquinonediazide-5-sulfonic acid chloride and 1 mole of purpurogallin, and 1,2-naphthoquinonediazide-5-(N-dihydroabietyl)-sulfonamide described in J. Kosar, "Light-Sensitive Systems", pp. 339 to 352 (1965), John Willey & Sons Co. (New York) and W. S. De Forest, "Photoresist", Vol. 50 (1975), McGraw Hill Co. (New York). Also, there may be mentioned 1,2-quinonediazide compounds described in Japanese Patent Publications No. 1953/1962, No. 3627/1962, No. 13109/1962, No. 26126/1965, No. 3801/1965, No. 5604/1970, No. 27345/1970 and No. 13013/1976 and Japanese Provisonal Patent Publications No. 96575/1973, No. 63802/1973 and No. 63803/1973.

Among the above o-quinonediazide compounds, particularly preferred ia an o-quinonediazide ester compound obtained by reacting 1,2-benzoquinonediazidesulfonyl chloride or 1,2-naphthoquinonediazidesulfonyl chloride with a pyrogallol. acetone condensed resin or 2,3,4-trihydroxybenzophenone.

As the o-quinonediazide compound to be used in the present invention, the above compounds may be used singly or in combination of two or more, respectively.

The ratio of the o-quinonediazide compound in the positive type light-sensitive composition is preferably 6 to 60% by weight, particularly preferably 10 to 50% by weight.

As an alkali-soluble resin, there may be mentioned polymers such as a novolak resin, a vinyl type polymer or copolymer having a phenolic hydroxyl group and a condensed resin of a polyvalent phenol and an aldehyde or a ketone described in Japanese Provisional Patent Publication No. 57841/1980.

As the novolak resin to be used in the present invention, there may be mentioned, for example, a phenol-formaldehyde resin, a cresol.formaldehyde resin, a phenol-.cresol.formaldehyde copolymer resin as described in Japanese Provisional Patent Publication No. 57841/1980 and a copolymer resin of p-substituted phenol and a phenol, or cresol and a formaldehyde as described in Japanese Provisional Patent Publication No. 127553/1980.

As to the molecular weight (based on polystyrene) of the above novolak resin, it is preferred that the number average molecular weight (Mn) is $3.00 \times 10^2$ to $7.50 \times 10^3$ and the weight average molecular weight (Mw) is $1.00 \times 10^3$ to $3.00 \times 10^4$. It is more preferred that Mn is $5.00 \times 10^2$ to $4.00 \times 10^3$ and Mw is $3.00 \times 10^3$ to $2.00 \times 10^4$.

The above novolak resins may be used singly or in combination of two or more.

The above novolak resin is contained in the positive type light-sensitive composition preferably in an amount of 5 to 95% by weight.

Further, the vinyl type copolymer having a phenolic hydroxyl group which is preferably used in the present invention is a polymer having a unit having the phenolic hydroxyl group in a molecular structure, preferably a polymer having at least one of the constitutional units represented by the formulae (I) to (V):

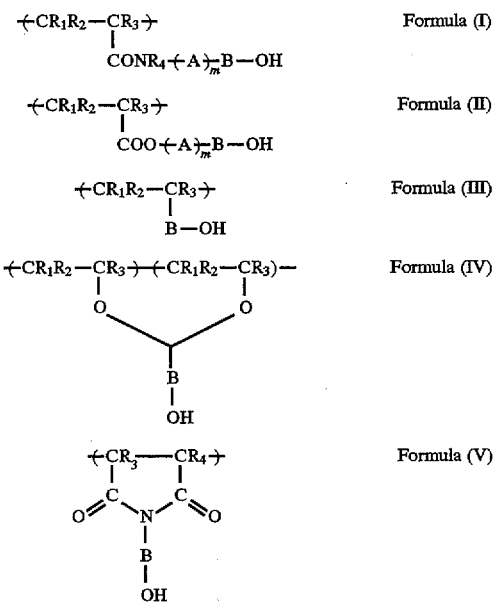

wherein $R_1$ and $R_2$ each represent a hydrogen atom, an alkyl group or a carboxyl group, preferably a hydrogen atom, $R_3$ represents a hydrogen atom, a halogen atom or an alkyl group, preferably a hydrogen atom or an alkyl group such as a methyl group and an ethyl group, $R_4$ represents a hydrogen atom, an alkyl group, an aryl group or an aralkyl group, preferably a hydrogen atom, A represents a substituted or unsubstituted alkylene group which links a nitrogen atom or an oxygen atom with an aromatic carbon atom, m represents an integer of 0 to 10 and B represents a substituted or unsubstituted phenylene group or a substituted or unsubstituted naphthylene group.

The polymer to be used in the present invention preferably has a copolymer type structure. As monomer units which can be used in combination with the constitutional units represented by the above formula (I) to formula (V), respectively, there may be mentioned ethylenic unsaturated olefins such as ethylene, propylene, isobutylene, butadiene and isoprene; styrenes such as styrene, a-methylstyrene, p-methylstyrene and p-chlorostyrene; acrylic acids such as acrylic acid and methacrylic acid; unsaturated aliphatic dicarboxylic acids such as itaconic acid, maleic acid and maleic anhydride; esters of α-methylene aliphatic monocarboxylic acid such as methyl acrylate, ethyl acrylate, n-butyl acrylate, isobutyl acrylate, dodecyl acrylate, 2-chloroethyl acrylate, phenyl acrylate, methyl α-chloroacrylate, methyl methacrylate and ethyl methacrylate; nitriles such as acrylonitrile and methacrylonitrile; amides such as acrylamide; anilides such as acrylanilide, p-chloroacrylanilide, m-nitroacrylanilide and m-methoxyacrylanilide; vinyl esters such as vinyl acetate, vinyl propionate and vinyl benzoate; vinyl ethers such as methyl vinyl ether, ethyl vinyl ether, isobutyl vinyl ether and β-chloroethyl vinyl ether; vinyl chloride; vinylidene chloride; vinylidene cyanide; ethylene derivatives such as 1-methyl-1-methoxyethylene, 1,1-dimethoxyethylene, 1,2-dimethoxyethylene, 1,1-dimethoxycarbonylethylene and 1-methyl-1-nitroethylene; and N-vinyl type monomers such as N-vinyl pyrrole, N-vinylcarbazole, N-vinylindole, N-vinylpyrrolidene and N-vinylpyrrolidone. These vinyl type monomers exist in a polymer compound in a structure of a cleaved double bond.

Among the above monomers, preferred are esters of aliphatic monocarboxylic acid and nitriles which show excellent characteristics to obtain the effect of the present invention.

These monomers may be bonded in the polymer to be used in the present invention in either of a block or random state.

The vinyl type (co)polymer to be used in the present invention is contained in the positive type light-sensitive composition preferably in an amount of 0.5 to 70% by weight.

As the vinyl type (co)polymer, the above polymers may be used singly or in combination of two or more, and further may be used in combination with other polymer compound.

The clathrate compound of the present invention is contained in the positive type light-sensitive composition preferably in an amount of 0.1 to 10% by weight, more preferably 0.5 to 5% by weight. If the amount is within the above range, two or more of the clathrate compounds may be used in combination.

To the positive type light-sensitive composition described above, a print-out material which forms a visible image by exposure to light can be added. The print-out material comprises a compound which forms an acid or a free group by exposure and an organic dye which changes its color tone by interaction with the acid or free group formed. As the compound which forms an acid or a free group by exposure, there may be mentioned, for example, o-naphthoquinonediazide-4-sulfonic acid halogenide described in Japanese Provisional Patent Publication No. 36209/1975, an ester compound or an amide compound comprising o-naphthoquinonediazide-4-sulfonic acid chloride and a phenol having an electron-attracting substituent or aniline described in Japanese Provisional Patent Publication No. 36233/1978 and a halomethylvinyloxadiazole compound and a diazonium salt described in Japanese Provisional Patent Publications No. 77742/1980 and No. 148784/1982.

To the positive type light-sensitive composition, in addition to the materials described above, a plasticizer, a surfactant, an organic acid and an acid anhydride may be added, if necessary.

To the positive type light-sensitive composition, for example, a p-tert-butylphenolformaldehyde resin, a p-n-octylphenolforaldehyde resin or a resin in which the above resin is partially esterified with an o-quinonediazide compound may be further added in order to improve ink receptivity of the positive type light-sensitive composition.

The light-sensitive lithograhic printing plate can be prepared by dissolving these respective components in a solvent described below and coating the resulting solution on the surface of the support, followed by drying, to provide the light-sensitive layer on the support.

As the solvent which can be used for dissolving the positive type light-sensitive composition of the present invention, there may be mentioned methyl cellosolve, methyl cellosolve acetate, ethyl cellosolve, ethyl cellosolve methyl cellosolve acetate, ethyl cellosolve, ethyl cellosolve acetate, diethylene glycol monomethyl ether, diethylene glycol monoethyl ether, diethylene glycol dimethyl ether, diethylene glycol methyl ethyl ether, diethylene glycol diethyl ether, diethylene glycol monoisopropyl ether, propylene glycol, propylene glycol monoethyl ether acetate, propylene glycol monobutyl ether, dipropylene glycol monomethyl ether, dipropylene glycol methyl dicarboxylate, dipropylene glycol methyl ethyl ether, ethyl formate, propyl formate, butyl formate, amyl formate, methyl acetate, ethyl acetate, propyl acetate, butyl acetate, methyl propionate, ethyl propionate, methyl butyrate, ethyl butyrate, dimethylformamide, dimethylsulfoxide, dioxane, acetone, methyl ethyl ketone, cyclohexanone, methylcyclohexanone, diacetone alcohol, acetylacetone and γ-butyrolactone. These solvents may be used singly or in combination of two or more.

As a coating method used for coating the positive type light-sensitive composition on the surface of the support, there may be used a conventionally known method, for example, rotational coating, wire bar coating, dip coating, air knife coating, roll coating, blade coating and curtain coating. The amount to be coated varies depending on the use, but may be preferably, for example, 0.05 to 5.0 g/m² as a solid component. The light-sensitive lithographic printing plate thus obtained can be processed by a conventionally used method. For example, a transparent original picture having a line image and a dot image is closely contected to a light-sensitive surface and subjected to exposure, and then a light-sensitive layer at a non-image portion is removed by using a suitable developing solution to obtain a relief image. As a suitable light source for exposure, there may be used a mercury lamp, a metal halide lamp, a xenon lamp, a chemical lamp and a carbon arc lamp.

Next, a developing solution which is preferably used in the present invention is described.

As the developing solution which is preferably used in the present invention, preferred is an alkaline aqueous solution, for example, an aqueous solution of sodium silicate, potassium silicate, sodium hydroxide, potassium hydroxide, sodium tertiary phosphate, sodium secondary phosphate, sodium carbonate or potassium carbonate. The concentration of the alkaline aqueous solution varies depending on the kinds of the positive type light-sensitive composition and alkali, but it is generally suitably in the range of 0.1 to 10% by weight. To the alkaline aqueous solution, a surfactant or an organic solvent such as alcohol may be added, if necessary.

As the organic solvent, there may be mentioned, for example, benzyl alcohol, 2-butoxyethanol, triethanolamine, diethanolamine, monoethanolamine, glycerin, ethylene glycol, polyethylene glycol and polypropylene glycol. Such an organic solvent can be contained in the developing solution or a replenishing solution within the range that the amount of the organic solvent is maintained 5% by weight or less based on the total weight of the developing solution.

In the developing solution or the replenishing solution which is preferably used in the present invention, a surfactant may be further contained. By incorporating the surfactant, processing capacity of the developing solution (an amount of a light-sensitive layer which can be dissolved to be removed by a unit volume of the developing solution) can be improved, and further ranges of developing conditions (temperature, processing time and others) which gives optimum results can be made wider. A preferred example of such a surfactant includes an anionic surfactant and an amphoteric surfactant. As a specific preferred example of the anionic surfactant, there may be included alkylbenzenesulfonates (the number of carbons of the alkyl group is 8 to 18, preferably 12 to 16) such as sodium dodecylbenzenesulfonate, alkylnaphthalenesulfonates (the number of carbons of the alkyl group is 3 to 10) such as sodium isopropylnaphthalenesulfonate, a formalin condensate of naphthalenesulfonate, dialkylsulfosuccinates (the number of carbons of the alkyl group is 2 to 18) and dialkylamidesulfonates (the number of carbons of the alkyl group is 11 to 17). As a specific preferred example of the amphoteric surfactant, there may be included imidazoline derivatives, for example, a betaine type compound such as N-alkyl-N,N,N-tris(carboxymethyl)ammonium (the number of carbons of the alkyl group is 12 to 18) and N-alkyl-N-carboxymethyl-N,N-dihydroxyethylammonium (the number of carbons of the alkyl group is 12 to 18). The amount of the surfactant to be used is not particularly limited, but the surfactant is generally contained in the developing solution or the replenishing solution so that the amount of the surfactant is about 0.003 to about 3% by weight, preferably in the range of 0.006 to 1% by weight based on the total weight of the developing solution at the time of use.

In the developing solution and the replenishing solution which are preferably used in the present invention, a defoaming agent may be further contained. As a suitable defoaming agent, there may be mentioned compounds described in U.S. Pat. Nos. 3,250,727 and 3,545,970 and U.K. Patents No. 1,382,901 and No. 1,387,713. Among them, an organic silane compound is preferred.

The replenishing solution is added in such an amount that components in the developing solution consumed by processing a positive type PS plate, and alkaline components in the developing solution which is taken out by being attached to a processed positive type PS plate and/or in the developing solution which is neutralized by carbon dioxide in the air are compensated. For example, when the amount of a positive type PS plate which can be processed by 1 liter of the developing solution used is 2 m², there may be used a method of adding a predetermined amount of the replenishing solution every time 2 m²/l of the positive type PS plate is processed, or a method of measuring the area of each PS plate to be processed and adding a suitable amount of the replenishing solution every time one PS plate is processed.

The developing capacity of the developing solution is generally determined as described below. That is, a PS plate is subjected to exposure through a step tablet (e.g., a step tablet with 21 grades in which optical density of a first grade is 0.10 and each difference in density between grades is 0.15), and the exposed PS plate is developed. The solid grade number (the number of the lowest grade among grades which are not dissolved by a developing solution) when the PS plate is processed by a fresh developing solution is compared with the solid grade number when the PS plate is processed by an exhausted developing solution. When the number of the latter case is lower by one grade, it is regarded that processing capacity of the developing solution has reached the limit. Thus, by finding such an amount of the replenishing solution that the original solid grade number can be developed by the developing solution having developing capacity which has reached the limit, there can be found a time to add the replenishing solution to the developing solution and an amount of the replenishing solution to be added.

Further, by finding pH of the developing solution having processing capacity which has reached the limit described above and pH of the fresh developing solution, it is possible to adopt, for example, a means that a pH-measuring device is integrated into a developing tank of an automatic processor, and the replenishing solution is added so as to maintain pH of the fresh developing solution constantly.

Irrespectively of a means for adding the replenishing solution, the replenishing solution is added so as to compensate change of components in the developing solution caused by developing the positive type PS plate and/or with a lapse of time, and/or so as to replenish an amount of the developing solution taken out with the developed PS plate.

EXAMPLES

The present invention is described in detail by referring to Examples.

Example 1

Preparation of support

An aluminum plate (material: 1050, temperting: $H_{16}$) having a thickness of 0.24 mm was degreased in a 5% by weight sodium hydroxide aqueous solution at 60° C. for 1 minute, washed and subjected to electrolytic etching in 1 liter of a 0.5 mole hydrochloric acid aqueous solution under conditions of a temperature of 25° C., a current density of 60 A/dm$^2$ and a treatment time of 30 seconds. Thereafter, the plate was desmutted in a 5% by weight sodium hydroxide aqueous solution at 60° C. for 10 seconds and then anodized in a 20% sulfuric acid solution under conditions of a temperature of 20° C. and a current density of 3 A/dm$^2$ for 1 minute. Further, the plate was subjected to pore-sealing treatment using hot water at 80° C. for 20 seconds to prepare a support.

On the above support, a UV absorber coating solution 1 having the following composition was coated by using a wire bar. The amount coated was 0.3 g/m$^2$, and drying was carried out at 90° C. for 2 minutes.

| (UV absorber coating solution 1) | |
| --- | --- |
| Water | 50 g |
| Methanol | 100 g |
| Diacid Light Yellow 2G (trade name, produced by Mitsubishi Kasei Corporation) | 0.3 g |

Preparation of Sample 1-1

On the support prepared as described above, a light-sensitive solution 1 having the following composition was coated by using a wire bar and dried at 90° C. for 1 minute to obtain Light-sensitive lithographic printing plate sample 1-1 having a light-sensitive layer. The thickness of the coating film after drying was 2 g/m$^2$.

| (Light-sensitive solution 1) | |
| --- | --- |
| Clathrate compound (β-cyclodextrin) | 0.15 g |
| Novolak resin (molar ratio of phenol/m-cresol/p-cresol: 10/54/36, Mw: 4,000) | 6.7 g |
| o-Naphthoquinonediazide compound (condensate of pyrogallol acetone resin (Mw: 3,000) and naphthoquinonediazide-5-sulfonyl chloride (esterification ratio: 30%)} | 1.5 g |
| Polyethylene glycol #2000 (trade name, produced by Daiichi Kogyo Seiyaku Co.) | 0.2 g |
| Victoria Pure Blue BOH (trade name, produced by Hodogaya Kagaku Co.) | 0.08 g |
| 2,4-Bis(trichloromethyl)-6-(p-methoxystyryl)-s-triazine | 0.15 g |
| Fluorine type surfactant FC-430 (trade name, produced by Sumitomo 3M Co.) | 0.03 g |
| Cis-1,2-cyclohexanedicarboxylic acid | 0.2 g |
| Methyl cellosolve | 100 ml |

Preparation of Sample 1-2

Sample 1-2 was prepared in the same manner as in Sample 1-1 described above except for replacing the clathrate compound (β-cyclodextrin) in the above light-sensitive solution 1 with cyclotriveratrylene.

Preparation of Sample 1-3

Sample 1-3 was prepared in the same manner as in Sample 1-1 described above except for changing the amount of the clathrate compound (β-cyclodextrin) in the above light-sensitive solution 1 from 0.15 g to 0.075 g and further adding 0.075 g of a clathrate compound cyclotriveratrylene.

Samples 1-1 to 1-3 described above were closely contacted with a Step tablet No. 2 (trade name, produced by Eastman Kodak Co., each density difference of 0.15, gray scale of 21 grades) for measuring sensitivity and an original copy of Burrner microdots (for observing reproducibility of microdots in 0.5 to 5% dot area) and exposed to light for 20 seconds from a distance of 90 cm by using a 2 kw metal halide lamp as a light source. Then, the exposed light-sensitive lithographic printing plates were developed by using a SDR-1 developing solution (trade name, produced by Konica Corporation) diluted to 6-fold with water, at 27° C. for 20 seconds. Each sensitivity, microdot reproducibility and residual colors were evaluated. The results are shown in Table 1.

The printing plates obtained by the above exposure and development were set in a printing machine Heidelberg GTO (trade name, produced by Heidelberger Druckinaschinen AG (Germany)), and printing was carried out by using a coated paper-printing ink High Plus Magenta (trade name, produced by Toyo Ink Seizo Co.) and a plate etch aqueous solution SEU-3 (2.5%, trade name, produced by Konica Corporation). Press life was evaluated by continuing printing until inking failure was caused at a solid image portion of a printed paper or inking was caused at a non-image portion, and counting the number of printed papers until then. The results are shown in Table 1.

Comparative Example 1

Preparation of Sample 1-4

Sample 1-4 was prepared in the same manner as in Sample 1-1 described above except for not using the clathrate compound (β-cyclodextrin) in the above light-sensitive solution 1. Sample 1-4 was subjected to exposure and development under the same conditions as in Samples 1-1 to 1-3 of Example 1, and the same evaluations of Sample 1-4 were conducted. The results are shown in Table 1.

TABLE 1

| Sample No. | Clear grade number | Micro-dot reproducibility | Press life | Residual colors | | Remarks |
|---|---|---|---|---|---|---|
| | | | | Yellow residual color | Blue from light-sensitive layer | |
| 1-1 | 4.25 | 1% | 110,000 | None | 0.01 | Present invention |
| 1-2 | 4.25 | 1% | 110,000 | None | 0.01 | Present invention |
| 1-3 | 4.25 | 1% | 110,000 | None | 0.01 | Present invention |
| 1-4 | 4.0 | 1% | 110,000 | Yellow residual color was observed partially | 0.05 | Comparative example |

Example 2 (Part 1)

Preparation of Support

An aluminum plate (material: 1050, tempering: H16) having a thickness of 0.24 mm was degreased in a 5% by weight sodium hydroxide aqueous solution at 60° C. for 1 minute, washed and subjected to electrolytic etching in 1 liter of a 0.5 mole hydrochloric acid aqueous solution under conditions of a temperature of 25° C., a current density of 60 A/dm$^2$ and a treatment time of 30 seconds. Thereafter, the plate was desmutted in a 5% by weight sodium hydroxide aqueous solution at 60° C. for 10 seconds and then anodized in a 20% sulfuric acid solution under conditions of a temperature of 20° C. and a current density of 3 A/dm$^2$ for 1 minute. Further, the plate was subjected to pore-sealing treatment using hot water at 80° C. for 20 seconds to prepare a support.

Preparation of Sample 2-1

On the above support, a UV absorber coating solution 2-1 having the following composition was coated by using a wire bar. Thereafter, a light-sensitive solution 2 having the following composition was coated on the support to prepare Sample 2-1. The pH of the UV absorber coating solution 2-1 was 5.0, the amount coated was 0.3 g/m$^2$, the absorption wavelength (400 nm) was 0.4 (increased by 0.15), and the reflection optical density DS was 0.2. The absorption wavelength was measured by using U-3210 (trade name, manufactured by Hitachi Co.), and the reflection optical density was measured by PDA 65 (trade name, manufactured by Konica Corporation).

| (UV absorber coating solution 2-1) | |
|---|---|
| Water | 50 g |
| Methanol | 100 g |
| Diacid Light Yellow 2G (trade name, produced by Mitsubishi Kasei Corporation) | 0.3 g |
| Novolak type resin SK-242 (trade name, produced by SUMITOMO DUREZ CO., LTD., molar ratio of phenol/m-cresol/p-cresol: 20/80/20, Mw: 3,700) | 0.3 g |

| (Light-sensitive solution 2) | |
|---|---|
| Novolak resin (molar ratio of phenol/m-cresol/p-cresol: 10/54/36, Mw: 4,000) | 6.7 g |
| o-Naphthoquinonediazide compound (condensate of pyrogallol acetone resin (Mw: 3,000) and naphthoquinonediazide-5-sulfonyl chloride (esterification ratio: 30%)} | 1.5 g |
| Polyethylene glycol #2000 (trade name, produced by Daiichi Kogyo Seiyaku Co.) | 0.2 g |
| Victoria Pure Blue BOH (trade name, produced by Hodogaya Kagaku Co.) | 0.08 g |
| 2,4-Bis(trichloromethyl)-6-(p-methoxystyryl)-s-triazine | 0.15 g |
| Fluorine type surfactant FC-430 (trade name, produced by Sumitomo 3M Co.) | 0.03 g |
| Cis-1,2-cyclohexanedicarboxylic acid | 0.2 g |
| Methyl cellosolve | 100 ml |

Preparation of Sample 2-2

In place of the UV absorber coating solution 2-1 of Sample 2-1 described above, a UV absorber coating solution 2-2 having the following composition was coated on a support by using a wire bar. Thereafter, the light-sensitive solution 2 having the above composition was coated on the support to prepare Sample 2-2. The pH of the UV absorber coating solution 2-2 was 6.5, the amount coated was 18 mg/m$^2$, the absorption wavelength (400 nm) was 0.42 (increased by 0.17), and the reflection optical density DS was 0.21.

| (UV absorber coating solution 2-2) | |
|---|---|
| Water | 50 g |
| Methanol | 100 g |
| Diacid Light Yellow 2G (trade name, produced by Mitsubishi Kasei Corporation) | 0.3 g |
| Hydroxypropyl cellulose LE-G (trade name, produced by Shinetsu Kagaku Kogyo Co.) | 0.3 g |

Preparation of Sample 2-3

In place of the UV absorber coating solution 2-1 of Sample 2-1 described above, a UV absorber coating solution 2-3 having the following composition was coated on a support by using a wire bar. Thereafter, the light-sensitive solution 2 having the above composition was coated on the support to prepare Sample 2-3. The pH of the UV absorber coating solution 2-3 was 5.0, the amount coated was 0.4 g/m$^2$, the absorption wavelength (400 nm) was 0.39 (increased by 0.14), and the reflection optical density DS was 0.19.

| (UV absorber coating solution 2-3) | |
|---|---|
| Water | 50 g |
| Methanol | 100 g |
| Diacid Light Yellow 2G (trade name, produced by Mitsubishi Kasei Corporation) | 0.3 g |
| Novolak type resin SK-242 (trade name, produced by SUMITOMO DUREZ CO., LTD., molar ratio of phenol/m-cresol/p-cresol: 20/80/20, Mw: 3,700) | 0.15 g |
| Hydroxypropyl cellulose LE-G (trade name, produced by Shinetsu Kagaku Kogyo Co.) | 0.15 g |

Samples 2-1 to 2-3 described above were closely contacted with a step tablet No. 2 (trade name, produced by Eastman Kodak Co., each density difference of 0.15, gray scale of 21 grades) for measuring sensitivity and an original copy of Burrner microdots (for observing reproducibility of microdots in 0.5 to 5% dot area) and exposed to light for 20 seconds from a distance of 90 cm by using a 2 kw metal halide lamp as a light source. Then, the exposed light-sensitive lithographic printing plates were developed by using a SDR-1 developing solution (trade name, produced by Konica Corporation) diluted to 6-fold with water, at 27° C. for 20 seconds. Each sensitivity, microdot reproducibility and residual colors were evaluated. The results are shown in Table 2.

The printing plates obtained by the above exposure and development were set in a printing machine Heidelberg GTO (trade name, produced by Heidelberger Druckinaschinen AG (Germany)), and printing was carried out by using a coated paper-printing ink High Plus Magenta (trade name, produced by Toyo Ink Seizo Co.) and a plate etch aqueous solution SEU-3 (2.5%, trade name, produced by Konica Corporation). Press life was evaluated by continuing printing until inking failure was caused at a solid image portion of a printed paper or inking was caused at a non-image portion, and counting the number of printed papers until then. The results are shown in Table 2.

Comparative Example 2

Preparation of Sample 2-4

In place of the UV absorber coating solution 2-1 of Sample 2-1 described above, a UV absorber coating solution 2-4 having the following composition was coated on a support by using a wire bar. Thereafter, the light-sensitive solution 2 having the above composition was coated on a support to prepare Sample 2-4. The pH of the UV absorber coating solution 2-4 was 7.2, the amount coated was 0.15 g/m², the absorption wavelength (400 nm) was 0.38 (increased by 0.13), and the reflection optical density DS was 0.19.

| (UV absorber coating solution 2-4) | |
|---|---|
| Water | 50 g |
| Methanol | 100 g |
| Diacid Light Yellow 2G (trade name, produced by Mitsubishi Kasei Corporation) | 0.3 g |

Sample 2-4 was subjected to exposure to light and development under the same conditions as in Samples 2-1 to 2-3 of Example 2, and the same evaluations of Sample 2-4 were conducted. The results are shown in Table 2.

TABLE 2

| | | Micro- | | Residual colors | | |
|---|---|---|---|---|---|---|
| Sample No. | Clear grade number | dot reproducibility | Press life | Yellow residual color | Blue from light-sensitive layer | Remarks |
| 2-1 | 4.0 | 1% | 200,000 | None | 0.01 | Present invention |
| 2-2 | 4.0 | 1% | 180,000 | None | 0.01 | Present invention |
| 2-3 | 4.0 | 1% | 170,000 | None | 0.01 | Present invention |
| 2-4 | 4.0 | 1% | 110,000 | Yellow residual color was observed partially | 0.05 | Comparative example |

Example 2 (Part 2)

When an experiment was made in the same manner except for using the equivalent amount of oxidized starch in place of the novolak type resin SK-242 in the UV absorber coating solution 2-1 of Sample 2-1 described above, substantially the same good results were obtained.

Similarly, when an experiment was made in the same manner except for using the equivalent amount of polyvinyl alcohol in place of the novolak type resin SK-242 in the UV absorber coating solution 2-1 of Sample 2-1 described above, substantially the same good results were obtained.

Similarly, when an experiment was made in the same manner except for using the equivalent amount of industrial gelatin in place of the novolak type resin SK-242 in the UV absorber coating solution 2-1 of Sample 2-1 described above, substantially the same good results were obtained.

According to the present invention, residual colors can be reduced and a high contrast of an image can be achieved by improving solubility of a light-sensitive layer without lowering press life.

We claim:

1. A presensitized printing plate which comprises an aluminum plate having a surface subjected to roughening treatment and then anodization treatment and colored by a solution containing a UV absorber so that at an absorption local maximum wavelength between 340 and 450 nm, reflection optical density DS is higher by 0.02 to 0.5 than that obtained when the surface is not colored, and a positive light-sensitive composition layer containing an o-quinonediazide compound and a clathrate compound provided by coating on the aluminum plate after coloration.

2. The plate of claim 1 wherein the clathrate compound is cyclodextrin.

3. The plate of claim 2 wherein cyclodextrin is β-cyclodextrin.

* * * * *